US008289297B2

(12) United States Patent
Weng et al.

(10) Patent No.: US 8,289,297 B2
(45) Date of Patent: Oct. 16, 2012

(54) TOUCH SCREEN SYSTEM WITH LIGHT REFLECTION

(75) Inventors: Wen-Pin Weng, Taipei (TW); Wen Hui Ko, Chong-Ho (TW)

(73) Assignee: Lunghwa University of Science and Technology (TW)

( * ) Notice: Subject to any disclaimer, the term of this patent is extended or adjusted under 35 U.S.C. 154(b) by 931 days.

(21) Appl. No.: 12/325,209

(22) Filed: Nov. 30, 2008

(65) Prior Publication Data

US 2009/0141006 A1    Jun. 4, 2009

Related U.S. Application Data

(63) Continuation of application No. 12/258,466, filed on Oct. 27, 2008.

(51) Int. Cl.
  *G06F 3/42* (2006.01)
(52) U.S. Cl. ........................................ 345/175; 359/618
(58) Field of Classification Search .......... 345/156–177; 359/618
See application file for complete search history.

(56) References Cited

U.S. PATENT DOCUMENTS

| 6,597,508 | B2* | 7/2003 | Seino et al. | 359/618 |
| 2005/0243070 | A1* | 11/2005 | Ung et al. | 345/176 |
| 2006/0097989 | A1* | 5/2006 | Ho | 345/173 |
| 2006/0227120 | A1* | 10/2006 | Eikman | 345/175 |

* cited by examiner

*Primary Examiner* — Quan-Zhen Wang
*Assistant Examiner* — Yuk Chow

(57) ABSTRACT

The present invention discloses a touch screen system comprising LED infrared transceivers installed at appropriate positions on left and right sides of the screen respectively, and a transmitter end of the transceiver transmits LED infrared waves and spreads spherical waves all over the surface of the screen. If the surface of the screen receives an intrusion from a touch control element, the spherical waves will be interfered, interrupted and reflected, and the wave frequency of the reflection will be detected by the receiver end of the transceiver. After the receiver end has received a reflection signal, the position coordinates of the touch control element can be analyzed through the operation of a core logical unit. A display module is provided for showing the movement path of the touch control element in images or lines, so as to provide a touch screen with low manufacturing cost and long life expectancy.

4 Claims, 2 Drawing Sheets

TOUCH SCREEN SYSTEM WITH LIGHT REFLECTION

This application is a Continuation-In-Part of my patent application, Ser. No. 12/258,466, filed on Oct. 27, 2008.

FIELD OF THE INVENTION

The present invention generally relates to touch screens, and more particularly to a touch screen system wherein the light emitting diode (LED) infrared waves is reflection interrupted.

BACKGROUND OF THE INVENTION

In a traditional touch screen, a sensor generally comes with a digital capacitance structure having two sensing layers installed at the top and bottom of a touch screen panel respectively and coupled to a control circuit, such that a capacitance effect is produced instantaneously when a user touches the touch screen panel by a finger or a conductor. However, such arrangement of using the change of capacitance to determine the position of the user's finger or the conductor exert stresses repeatedly on the touch screen panel, and this design has the drawback of deforming or damaging the touch screen panel easily.

Later, manufacturers developed a touch screen that measures and determines the user's finger or the conductor by blocking infrared light, but such design requires a large number of touch control elements arranged linearly or in rows on the screen for one-to-one transmission and receiving. Obviously, this design has the drawback of incurring a higher cost.

To overcome the shortcomings of the prior art, the inventor of the present invention, based on years of experience in the related industry. develops a touch screen system that reflects and interrupts the LED infrared waves.

SUMMARY OF THE INVENTION

Therefore, it is a primary objective of the present invention to provide a touch screen system with light reflection, and the touch screen system comprises an LED infrared transceivers installed at appropriate positions on both left and right sides of the screen respectively, and a transmitter end of the transceiver transmits LED infrared waves and spreads spherical waves all over the surface of the screen, such that if the surface of the screen receives an intrusion from the touch control element, the spherical waves will be interfered, interrupted and reflected, and the wave frequency of the reflection will be detected by the receiver end of the transceiver. After the receiver end has received a reflection signal, the position coordinates of the touch control element can be analyzed through the operation of a core logical unit. In addition to the advantages of low manufacturing cost and fast signal transmission, the present invention also overcomes the aforementioned shortcoming of the traditional capacitance type touch screen being deformed or damaged easily by repeated exertions of stress to enhance the life and popularity of the touch screen.

DETAILED DESCRIPTION OF PREFERRED EMBODIMENTS

Figure 1:
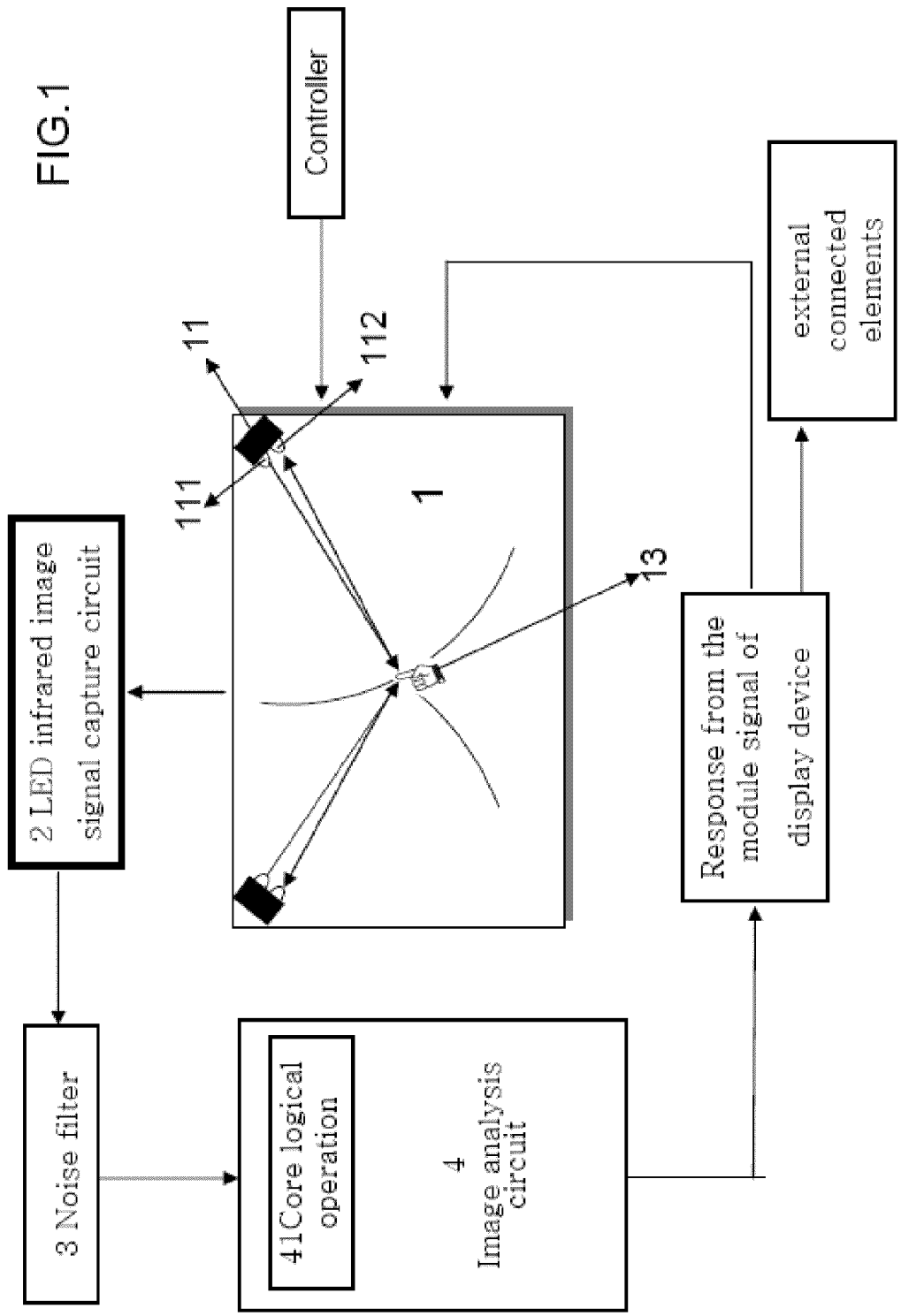
FIG. 1 shows a schematic diagram of a touch screen system with light reflection in accordance with a preferred embodiment of the present invention.

With reference to FIG. 1, a touch screen system in accordance with a preferred embodiment of the present invention comprises a screen 1 and an LED infrared transceiver 11 disposed separately at appropriate positions on both sides of the screen 1 and having a transmitter end 111 and a receiver 112 for transmitting and receiving LED infrared waves respectively. The LED infrared waves transmitted from the transmitters 111 on both sides form spherical waves all over the entire screen 1 to constitute an image signal detection net, such that if a touch control element 13 intrudes the image signal detection net, the LED infrared waves will be interrupted and reflected, and the receiver end 112 will be able to receive the reflected waves to capture target images and transmit the target images to an LED infrared image signal capture circuit 2 electrically coupled to the receiver end 112. After going through a noise filter 3, the target images are transmitted to an image analysis circuit 4, and a core logical operation 41 is provided for comparing two target images and computing the positions of the touch control element 13 corresponding to the two target images on the screen 1.

In the aforementioned core logical operation, there is a time difference between the moment of transmitting a light wave from the transmitter end 111 to touch the touch control element 13 and the moment of receipt of the light wave by the receiver end 112. The time difference is multiplied by the speed of light to obtain the distance between the touch control element 13 and the LED infrared transceiver 11. The mediate point between the transmitter end 111 and the receiver end 112 is used as the center and the distance is used as a radius to form a quarter circle. The LED infrared transceivers 11 on both sides form their respective quarter circuits by the same way. The intersection point of the two quarter circles formed on the screen 1 is processed to indicate the position coordinates of the touch control element 13 on the screen 1.

Figure 2:
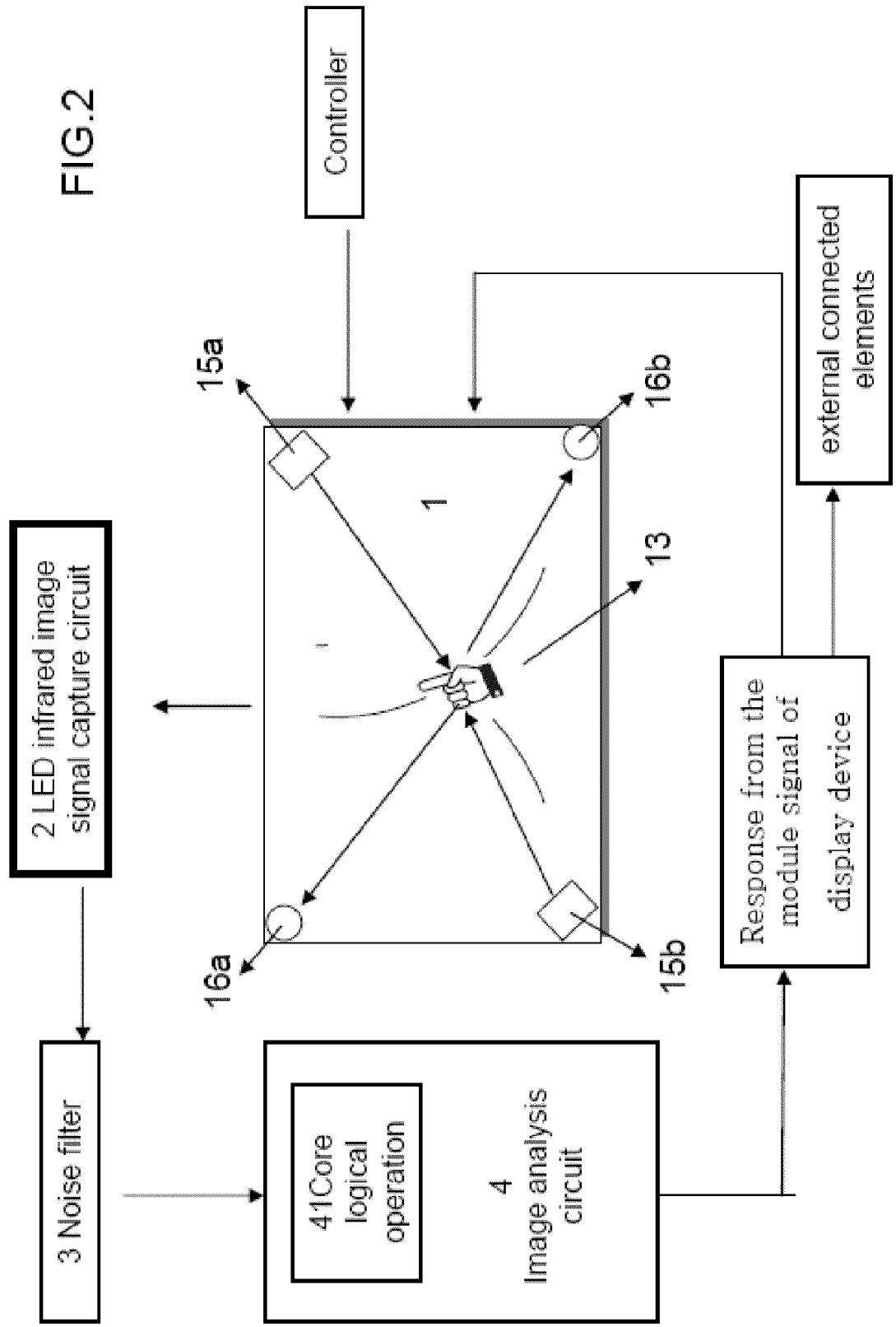
FIG. 2 shows a schematic diagram of a touch screen system with light reflection in accordance with another preferred embodiment of the present invention.

With reference to FIG. 2, a touch screen system in accordance with a second preferred embodiment of the present invention comprises a transmitter end 111 and a receiver end 112, both of which are originally installed in a same component in the first embodiment, and are installed at different positions on the screen 1 in the second embodiment, wherein the two transmitter ends 111 and two receiver ends 112 are installed diagonally with each other. In other words, each transmitter end 111 and each receiver end 112 are installed on the same side, and two diagonally installed transmitter ends 111 can transmit LED infrared waves to spread spherical waves all over the screen 1. If a touch control element 13 intrudes the spherical waves to interrupt the wavelength, a reflection will be formed by the interrupted wavelength and detected by the receiver end 112 to form a target signal. The target signal is transmitted to the LED infrared image signal capture circuit 2 electrically coupled to the receiver end 112. After going through the noise filter 3, the target signal is transmitted to the image analysis circuit 4. The core logical operation is provided to compare two target signals and calculate the position of the touch control element 13 corresponding to the two target images.

The aforementioned core logical operation method is the same as the one illustrated in FIG. 1, wherein there is also a time difference between the moment of transmitting a light wave from the transmitter end 111 to touch the touch control element 13 and the moment of receipt of the light wave by the receiver end 112. The time difference is multiplied by the speed of light to obtain the distance between the touch control element 13 and the LED infrared transceiver 11. The mediate point between the transmitter end 111 and the receiver end 112 is used as the center and the distance obtained is used as a radius to form a quarter circle. The intersection point of the two quarter circles formed on the screen 1 indicates the position coordinates of the touch control element 13 on the screen 1.

While we have shown and described the embodiment in accordance with the present invention, it should be clear to those skilled in the art that further embodiments may be made without departing from the scope of the present invention.

What is claimed is:

1. A touch screen system, comprising:
    a screen;
    at least one light emitting diode (LED) infrared transceiver, disposed at a position of the screen;
    an LED infrared image signal capture circuit electrically coupled to the LED infrared transceiver for capturing a target image detected by a receiver end of the LED infrared transceiver; and
    an image analysis circuit electrically coupled to the LED infrared image signal capture circuit so as to compute the target image for obtaining a distance by multiplying the time difference between the transmission and receipt of the light waves with the speed of light, using the mediate point between the transmitter end and the receiver end as a center, wherein the computed distance as a radius is adopted to form a quarter circle at two sides respectively, and an intersection point of the two quarter circles indicates the position coordinates of the touch control element on the screen.

2. The touch screen system of claim 1, further comprising a noise filter electrically coupled between the LED infrared image signal capture circuit and the image analysis circuit.

3. The touch screen system of claim 1, wherein the transmitter end and the receiver end of the LED infrared transceiver are disposed in a same component or disposed separately in different components.

4. The touch screen system of claim 3, wherein the separately disposed transmitter end and receiver end are installed diagonally with respect to each other.

* * * * *